US006882101B2

(12) United States Patent
Ragle

(10) Patent No.: US 6,882,101 B2
(45) Date of Patent: *Apr. 19, 2005

(54) INTEGRATED COLOR LED CHIP

(75) Inventor: Larry Ragle, Hudson (CA)

(73) Assignee: The Fox Group Inc., Ripon, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/772,612

(22) Filed: Feb. 5, 2004

(65) Prior Publication Data

US 2004/0222735 A1 Nov. 11, 2004

Related U.S. Application Data

(63) Continuation of application No. 09/891,972, filed on Jun. 26, 2001, now Pat. No. 6,737,801.
(60) Provisional application No. 60/214,505, filed on Jun. 28, 2000.

(51) Int. Cl.[7] .............................. H01J 1/62; H01J 63/04
(52) U.S. Cl. ........................ 313/501; 313/506; 313/113; 257/88; 257/89
(58) Field of Search .................. 313/506, 498, 313/500, 501, 502, 113; 428/690; 257/88, 89

(56) References Cited

U.S. PATENT DOCUMENTS

| | | | |
|---|---|---|---|
| 5,693,962 A | 12/1997 | Shi et al. ...................... 257/89 |
| 5,705,285 A | 1/1998 | Shi et al. ...................... 428/690 |
| 5,994,722 A | 11/1999 | Averbeck et al. .............. 257/89 |
| 6,091,195 A | 7/2000 | Forrest et al. ............... 313/504 |
| 6,737,801 B1 * | 5/2004 | Ragle .......................... 313/506 |

* cited by examiner

*Primary Examiner*—Joseph Williams
*Assistant Examiner*—Kevin Quarterman
(74) *Attorney, Agent, or Firm*—Patent Law Office of David G. Beck

(57) ABSTRACT

A method and apparatus for achieving multicolor displays using an integrated color chip is provided. The integrated color chip contains one or more multicolor generation sites on a single substrate. Each multicolor generation site is comprised of two or more light emitting regions in close proximity to one another, the number of light emitting regions per site dependent upon the number of required colors. The active light generation system for each light emitting region, e.g., an LED, is preferably identical in device structure although size and shape may vary. In order to achieve the desired colors, one or more light conversion layers are applied to individual light emitting regions. Each light emitting region may also include index matching layers, preferably interposed between the outermost surface of the light emitter and the light conversion layer, and protective layers. In order to minimize cross-talk and achieve improved contrast, opaque material is preferably deposited between adjacent light emitting regions. Cross-talk may also be minimized by locating the light emitting regions on a substantially non-reflective substrate.

28 Claims, 3 Drawing Sheets

US 6,882,101 B2

INTEGRATED COLOR LED CHIP

CROSS-REFERENCES TO RELATED APPLICATIONS

This application is a continuation of U.S. patent application Ser. No. 09/891,972, filed Jun. 26, 2001, now U.S. Pat. No. 6,737,801, which claims benefit from Provisional Application Ser. No. 60/214,505, filed Jun. 28, 2000.

FIELD OF THE INVENTION

The present invention relates generally to multicolor display devices and, more particularly, to a method and apparatus for achieving multiple colors on an integrated chip.

BACKGROUND OF THE INVENTION

Multicolor generation systems are used in a variety of applications including monitors (e.g., direct and projection televisions, computer monitors), macro-displays (e.g., billboards), and micro-displays (e.g., telephones and PDAs). Currently a number of different techniques are used to achieve multicolor displays. For example, depending upon application requirements such as contrast, brightness, color range, color accuracy, power consumption, size and cost, a display may utilize light generation systems based on everything from CRTs to LCDs.

Currently, the emphasis on full-featured microelectronic systems has resulted in manufacturers working to develop more efficient, multicolor displays that can replace the simple monotone displays common in such devices. Although LCD display based systems have proven adequate for some applications, device complexity and cost have prohibited their use for the majority of such systems. The present invention overcomes the obstacles associated with the prior approaches and provides a simple display device that can be tailored to meet varying color and display size requirements.

SUMMARY OF THE INVENTION

The present invention provides a method and apparatus for achieving multicolor displays using an integrated color chip. The integrated color chip contains one or more multicolor generation sites on a single substrate. Each multicolor generation site is comprised of two or more light emitting regions, preferably LEDs, in close enough proximity to one another to achieve color integration. The active light generation system for each light emitting region, e.g., an LED, is preferably identical in device structure although size and shape may vary. In order to achieve the desired colors, one or more light conversion layers are applied to individual light emitting regions. Thus, for example, a simple three color generation site may include three blue light emitting LEDs, one of which includes a blue-to-green light conversion layer and one of which includes a blue-to-red light conversion layer. Each light emitting region may also include index matching layers, preferably interposed between the outermost surface of the light emitter and the light conversion layer, and protective layers.

The number of required light emitting regions per multicolor generation site depends upon the application. For example, a two color system comprised of a blue color emitting region and a yellow color emitting region can be used to produce a range of colors, including white. Alternately, a complete color range can be achieved using a three color system comprised of three light emitting regions. Preferably the three light emitting regions in combination with the required light conversion layers emit three primary additives such as red light, green light, and blue light.

In at least one embodiment of the invention, opaque material is deposited between adjacent light emitting regions thereby minimizing cross-talk and achieving improved contrast. In at least one other embodiment of the invention, cross-talk due to substrate reflections is minimized by removing the light emitting regions from the substrate on which they were grown and affixing them to a secondary, support substrate. In at least one other embodiment of the invention, cross-talk due to substrate reflections is minimized by interposing an absorbing or partially reflective material between the substrate and the light emitting regions.

A further understanding of the nature and advantages of the present invention may be realized by reference to the remaining portions of the specification and the drawings.

DESCRIPTION OF THE SPECIFIC EMBODIMENTS

Figure 1:
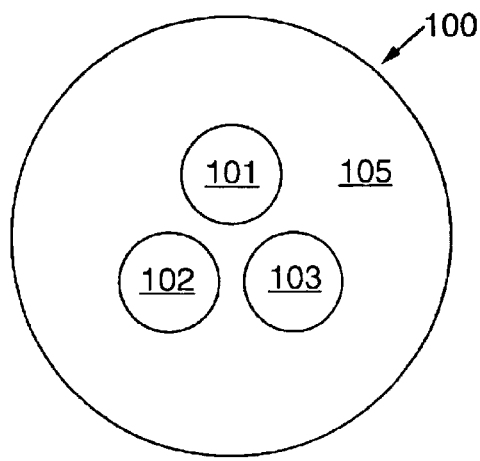
FIG. 1 is a top view of an embodiment of the invention comprised of a three color integrated color chip.
Figure 2:
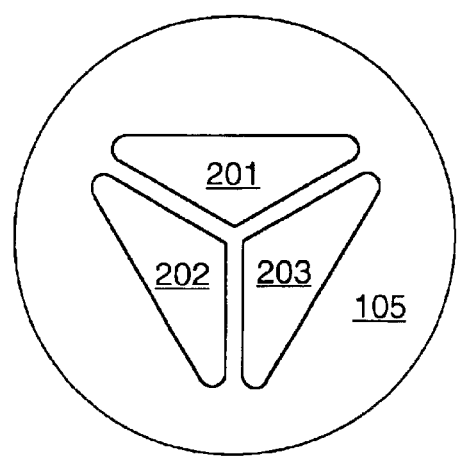
FIG. 2 is a top view of an alternate embodiment of the invention with an improved emitter packing density.
Figure 3:
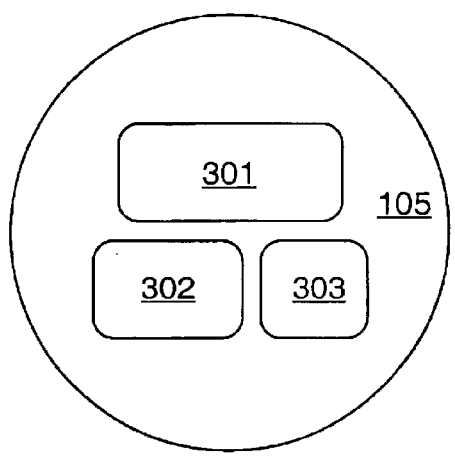
FIG. 3 is a top view of an alternate embodiment of the invention in which the light emitting regions are of different dimensions to compensate for variations in perceived light intensity.

FIG. 1 is an illustration of an embodiment of the invention. In the embodiment shown, an integrated color chip (ICC) 100 contains a single set of color emitting regions 101–103 residing on a single substrate 105 (e.g., a substrate comprised of sapphire, silicon carbide, gallium nitride, etc.). Preferably light emitting regions 101–103 are in sufficiently close proximity to one another to facilitate color integration by an observer. It will be understood that as the apparent distance between ICC 100 and the observer increase, the required spacing between light emitting regions 101–103 increases. Although each light emitting region 101–103 is illustrated as having a circular shape, it is understood that the inventor envisions other shapes. For example, as shown in FIG. 2, light emitting regions 201–203 are non-circular in order to achieve improved packing density. Alternately, as shown in FIG. 3, light emitting regions 301–303 are of different dimensions, the dimensional variations compensating for variations in perceived light intensity from the different emitting regions, thus achieving a balanced output.

In the preferred embodiment of the invention, each individual light emitting region (e.g., regions 101–103, 201–203, and 301–303) is comprised of a light emitting diode (LED) and, as required to achieve the desired color, a color (i.e., wavelength) conversion layer (e.g., one or more phosphor and/or active polymer layers). Preferably the LEDs emit violet or blue light (i.e., in the wavelength range of between 4,000 and 4,912 Angstroms) although it is understood that the invention can utilize other wavelength LEDs. The LED structures can be manufactured using a variety of fabrication techniques that are well known by those of skill in the art. In the preferred embodiment of the invention, the LED structures are grown on substrate 105 using the HVPE techniques disclosed in pending U.S. patent application Ser. No. 09/861,011, pages 7–15, the teachings of which are hereby incorporated by reference. However, other device manufacturing techniques such as MOCVD and MBE can also be used to fabricate the LED structures of the present invention.

Figure 4:
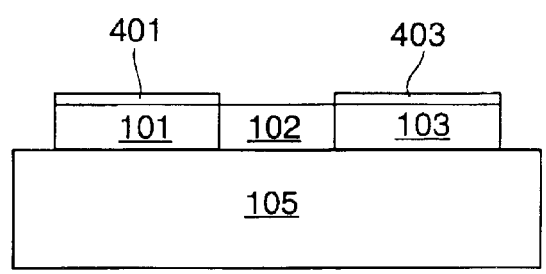
FIG. 4 is a cross-sectional view of an embodiment of the invention.

Assuming that the LED structures emit blue light, only two of the three light emitting regions require color conversion layers in order to achieve a tristimulus color space that can be used to generate any desired color. For example and as illustrated in FIG. 4, by applying a conversion layer 401 to light emitting region 101 to down frequency convert the emitted blue light to green light (i.e., in the wavelength range of between 4,912 and 5,750 Angstroms), and applying a conversion layer 403 to light emitting region 103 to down frequency convert the emitted blue light to red light (i.e., in the wavelength range of between 6,470 and 7,000 Angstroms), the standard set of additive primaries can be generated (i.e., red, green and blue or RGB). It is understood that the invention can also be used to generate non-RGB light emissions for a variety of applications, some of which do not require the ability to generate all colors. For example, the invention can be used to generate a subset of the visible colors with only two light emitting regions.

The light converting coatings, for example blue-to-green layer 401 and blue-to-red layer 403, are preferably deposited onto the designated light emitting regions using standard coating techniques as are well known by those of skill in the art. For example, the first conversion layer (e.g., layer 401) can be deposited by spraying or spin coating followed by a curing step. Once cured, the coating is selectively removed by standard photolithographic techniques so that only predetermined light emitting regions (or region for a structure comprised of only three light emitting regions) are covered by the conversion layer. The same process is then used to coat the second conversion layer (e.g., layer 403). It is understood that a variety of other well known techniques can be used to deposit the desired light conversion layers. For example, a masking system can be used to selectively coat predetermined light emitting regions, the masking system used in conjunction with a liquid, evaporative, or other coating technique. Alternately, an automated, microrobotic drop dispenser can be used to deposit the conversion layers on each of the designated light emitting regions.

Figure 5:
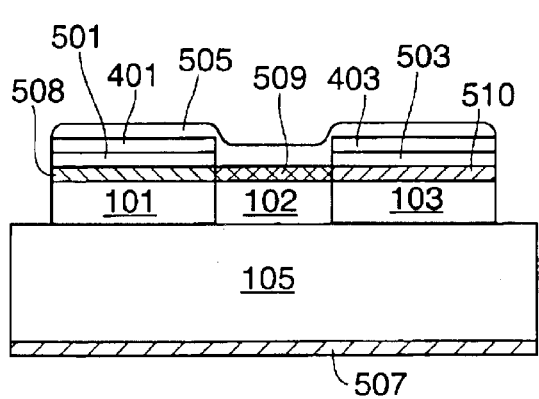
FIG. 5 is a cross-sectional view of an alternate embodiment of the invention.

Preferably an index of refraction matching layer 501 is interposed between light emitting region 101 and light converting coating 401 and an index of refraction matching layer 503 is interposed between light emitting region 103 and light converting coating 403 as illustrated in FIG. 5. Matching layers 501 and 503 are selected from a class of transparent materials having an index of refraction between that of the underlying semiconductor material and that of the overlying light conversion coating. The matching layers facilitate the definition of the conversion layers by planarizing or partially planarizing the light emitting regions prior to the application of the conversion layers. Matching layers 501 and 503 are preferably deposited using the same techniques used to deposit the conversion layers, thus simplifying the fabrication process.

In some embodiments of the invention, a protective layer 505 is deposited onto the device. Protective layer 505 provides an environmental sealant for the device and, more particularly, for the conversion layers. Additionally, layer 505 is preferably designed to provide an index of refraction matching layer to the ambient environment (e.g., air) and to provide lensing to converge the emitted light rays and project them away from the device's surface. As shown in FIG. 5, protective layer 505 covers all three light emitting regions although it is understood that the protective layer can be deposited on only a portion of the device structure (e.g., only on the light conversion layers). Preferably protective layer 505 is deposited using the same techniques as used with the conversion layers, thus simplifying the fabrication process.

In the preferred embodiment of the invention, a first contact 507 is located on the lower surface of substrate 105. A second contact is deposited on the upper surface of each light emitting region prior to the application of the index matching layers (e.g., 501 and 503), light conversion layers (e.g., 401 and 403), and/or any protective layers (e.g., 505). In the illustrated embodiment, contact 508 corresponds to light emitting region 101, contact 509 corresponds to light emitting region 102, and contact 510 corresponds to light emitting region 103.

A variety of techniques can be used to connect to the contacts located on the upper surfaces of the emitting regions. For example, after all of the desired coating layers are applied to the light emitting regions, a photoresist mask can be used in conjunction with an etching system to expose bonding areas (e.g., bonding pads) on each of the contacts (e.g., contacts 508–510). Alternately, laser ablation can be used to remove portions of the coating layers, thereby exposing bonding areas. Alternately, leads can be coupled to the contacts prior to the application of the coatings. Alternately, wrap-around contacts can be applied such that a portion of the contact wraps-around the edge of the light emitting regions. Leads can be coupled to the edge contacts prior to the application of the coatings or after subsequent exposure of the edge contacts by an etching or ablation technique. Alternately, after deposition of an insulating layer over the entire ICC and exposure of a bonding area on each contact, leads can be coupled to the contacts and connected to bonding regions on the edges of the ICC. In some embodiments, the insulating layer also acts as the index matching layer interposed between the light emitting regions and the light conversion layers. In other embodiments, the insulating layer is interposed between the light emitting regions and the index matching layer.

Figure 6:
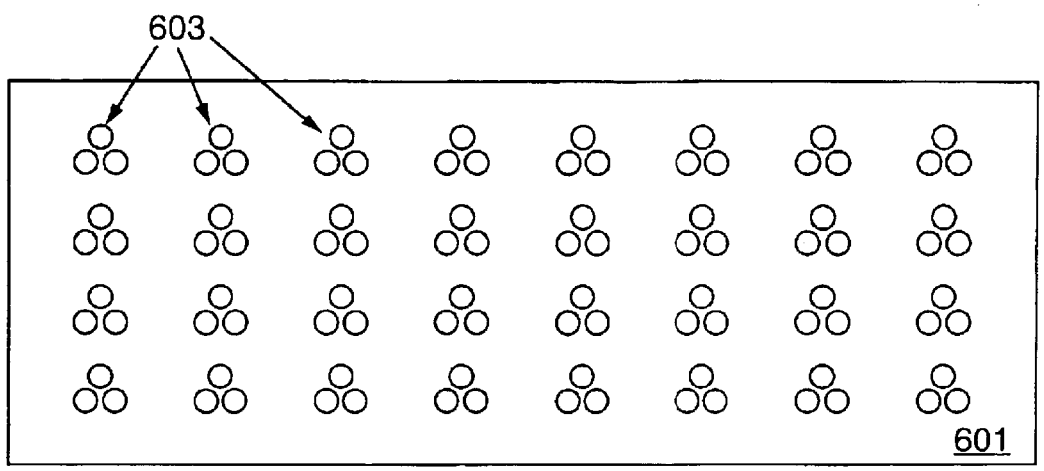
FIG. 6 is an illustration of an integrated color chip containing a plurality of multicolor sites.

It is understood that the above-identified embodiments, for example the configurations illustrated in FIGS. 1–3, are meant to be illustrative, and not limiting, of the invention. For example, the ICCs illustrated in these figures include only three light emitting regions per substrate. FIG. 6 illustrates a preferred embodiment of the invention in which a single substrate 601 includes a plurality of multicolor generation sites 603. Preferably each multicolor generation site 603 is comprised of three individual light emitting regions, at least two of which use color conversion layers as previously described, although it is understood that each multicolor generation site 603 may be comprised of either fewer or greater numbers of individual light emitters. Additionally, it is understood that not all of the multicolor generation sites on a single substrate must be comprised of an equivalent number of individual light emitters.

Although the above-described embodiments provide multiple colors, improved contrast can be achieved by suppressing cross-talk between individual light emitting regions. The cross-talk phenomenon is illustrated in the cross-sectional view of a simplified device 700 provided in FIG. 7. As shown, two adjacent light emitting regions 701 and 703 are contained on a single substrate 105. Light emitting region 701 includes a light conversion layer 705 and light emitting region 703 includes a light conversion layer 707. At a given time x, light emitting region 701 is activated. In addition to the light 709 emitted from the upper surface of 701, which passes through conversion layer 705, additional light is emitted from the side of region 701 (e.g., light 711) as well as the bottom surface of region 701 (e.g., light 713). A portion of the side emitted light 711 and, to a lesser extent, bottom emitted light 713, may pass through adjacent region 703 and/or conversion layer 707. As a result, when one light emitting region is activated (e.g., 701) a portion of unintended light is emitted by the adjacent region (e.g., 703).

Figure 8:
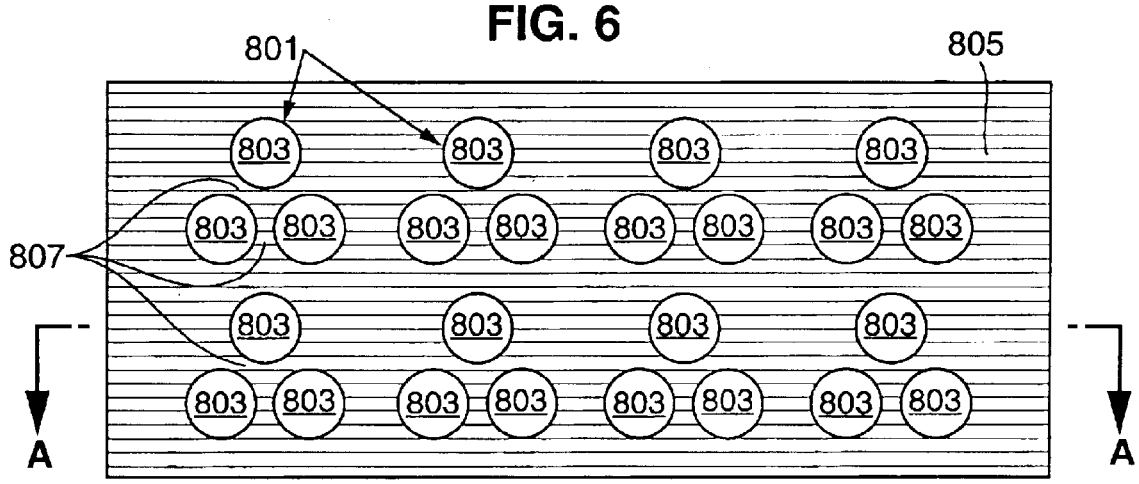
FIG. 8 illustrates one method of isolating adjacent light emitting regions.

In an embodiment of the invention illustrated in FIG. 8, a plurality of multicolor sites 801, each comprised of three light emitting regions 803, is grown/deposited on a single substrate 805. It is understood that preferably adjacent light emitting regions 803 utilize different color conversion layers in order to achieve the desired multicolor system as described above. In the embodiment of the invention illustrated in FIG. 8 and further illustrated in FIG. 9, individual light emitting regions 803 are isolated from adjacent regions with an opaque material 807 (e.g., low temperature glass, epoxy, or any of a variety of opaque organic materials). Opaque material 807 can be deposited, for example, using standard photolithographic coating techniques or any of a variety of other well known techniques such as a masking system used in conjunction with a liquid, evaporative, or other coating technique. In an alternate embodiment of the invention illustrated in FIG. 10, channels 1001 are formed between the light emitting regions, for example using an ion etching or plasma etching system, prior to filling in the channels with opaque material 807.

Figure 7:
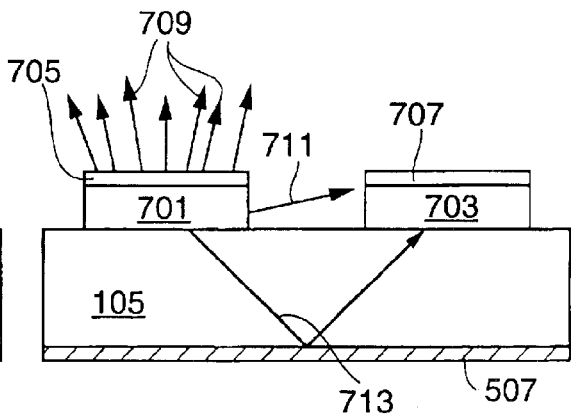
FIG. 7 illustrates cross-talk between adjacent light emitting regions.
Figure 9:
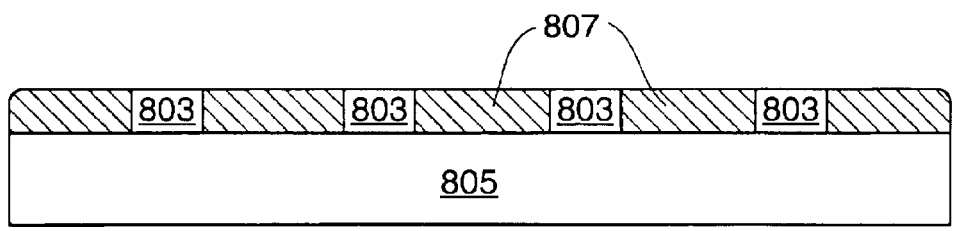
FIG. 9 is a cross-sectional view taken along plane A—A of the embodiment shown in FIG. 8.
Figure 10:
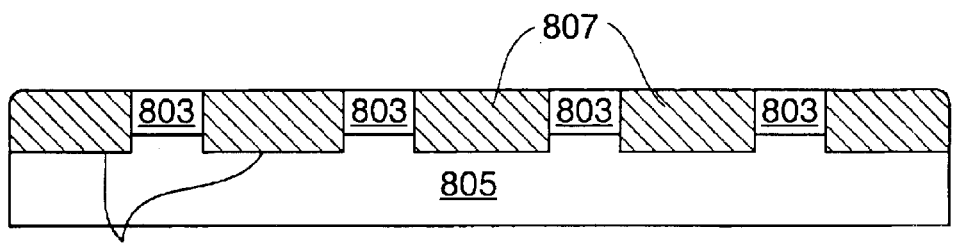
FIG. 10 is a cross-sectional view of an alternate method of minimizing cross-talk due to edge emissions.
Figure 11:
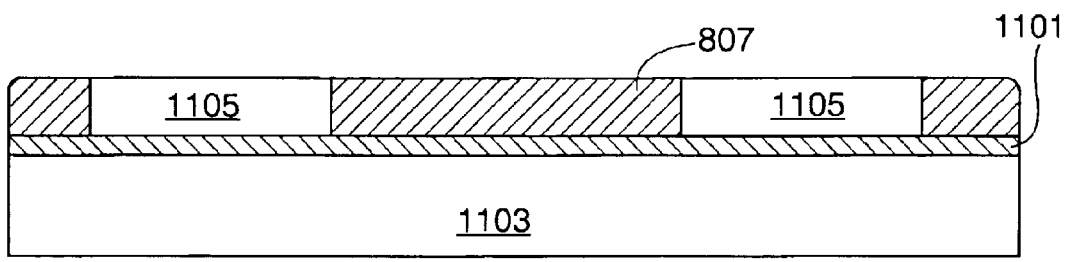
FIG. 11 is a cross-sectional view of an embodiment of the invention designed to minimize cross-talk due to light emitted into the substrate.
Figure 12:
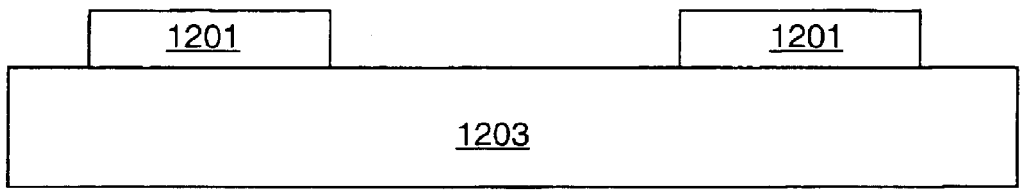
FIG. 12 illustrates the first stage of an alternate approach to minimizing cross-talk between the individual light emitting regions of the invention.
Figure 13:
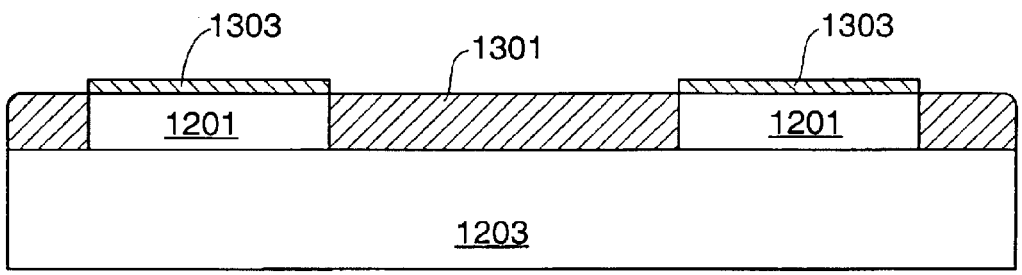
FIG. 13 illustrates the second stage of an alternate approach to minimizing cross-talk between the individual light emitting regions of the invention.
Figure 14:
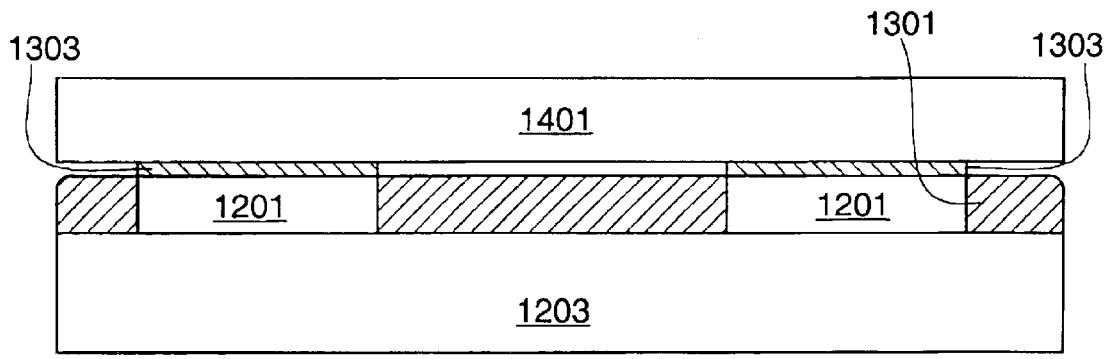
FIG. 14 illustrates the third stage of an alternate approach to minimizing cross-talk between the individual light emitting regions of the invention.
Figure 15:
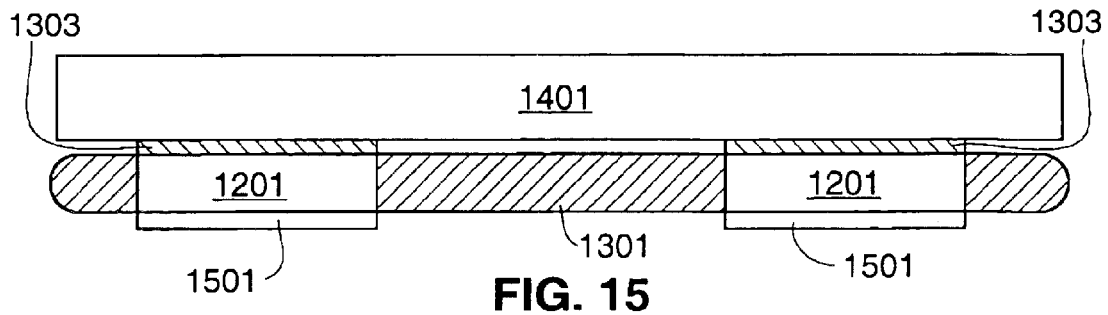
FIG. 15 illustrates the fourth stage of an alternate approach to minimizing cross-talk between the individual light emitting regions of the invention.

Although the embodiments illustrated in FIGS. 8–10 aid in the elimination of cross-talk resulting from edge emissions, these embodiments do not significantly impact cross-talk arising from light emitted into substrate 805 (e.g., light 713 shown in FIG. 7). One approach to minimizing cross-talk due to light emitted into the substrate is illustrated in FIG. 11. As shown, a layer 1101 is grown or deposited on the surface of substrate 1103 prior to the growth of light emitting regions 1105. Layer 1101 can be designed to be substantially absorbing, opaque, or reflective to certain wavelengths in order to minimize undesired substrate reflections. For example, layer 1101 can be a distributed Bragg reflector, preferably comprised of a three region stack optimized for the three wavelengths of interest (e.g., red, green and blue light). Preferably, as in the prior example, the area between adjacent regions 1105 is filled with opaque material 807. It is understood that light emitting regions 1105 include, as previously described, light conversion layers as required to achieve the desired wavelengths, contact structures, protective coatings (if desired) and index matching layers (if desired).

FIGS. 12–15 illustrate an alternate approach to minimizing cross-talk between light emitting regions. During the first stage of device fabrication, illustrated in FIG. 12, light emitting regions 1201 are grown on substrate 1203. The order of the layers (e.g., the n-type and p-type layers) comprising regions 1201 is reversed from the desired final order. During the second stage of device fabrication, illustrated in FIG. 13, opaque material 1301 is deposited between adjacent regions 1201 in order to isolate the edges of the emitting regions. Additionally, the top surfaces of regions 1201 are coated with a contact layer 1303. Preferably contact layer 1303 is comprised of metal and is opaque to visible light, and more preferably reflective of visible light. During the third stage of device fabrication, illustrated in FIG. 14, a second substrate 1401 is coupled to the top surfaces of regions 1201, preferably via interposed contact layers 1303. The coupling surface of substrate 1401 may be conductive, thus allowing voltage to be simultaneously applied to one surface (e.g., contact layer 1303) of all emitting regions 1201. Alternately, substrate 1401 may include a plurality of leads that correspond to individual regions 1201 (e.g., individual contact layers 1303), thus allowing voltage to be applied selectively to regions 1201. In the last stage of device fabrication, illustrated in FIG. 15, substrate 1203 is removed, for example by using an etching or ultraviolet laser heating technique. After exposure of regions 1201, suitable light conversion layers 1501 are applied as described above. Additionally, index matching layers, protective layers, and contact structures are applied as described above.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A multicolor display comprising
   a substrate; and
   at least one multicolor generation site coupled to said substrate, each of said at least one multicolor generation sites comprised of:
      at least two light emitting regions proximate to one another;
      at least one wavelength conversion layer applied to at least one of said at least two light emitting regions, wherein said at least two light emitting regions in combination with said at least one wavelength conversion layer emit at least two different colors; and
      an opaque material interposed between said at least two light emitting regions, said opaque material preventing cross-talk between said at least two light emitting regions.

2. A multicolor display comprising
   a substrate; and
   a multicolor generation site grown on said substrate comprising:
      at least two LEDs proximate to one another;
      a first wavelength conversion layer applied to a light emitting surface of a first of said at least two LEDs, wherein said at least two LEDs in combination with said first wavelength conversion layer emit at least two different colors; and an opaque material interposed between said at least two LEDs, said opaque material preventing cross-talk between said at least two LEDs.

3. The multicolor display of claim 2, wherein said at least two LEDs are comprised of three individual LEDs proximate to one another.

4. The multicolor display of claim 3, further comprised of a second wavelength conversion layer applied to a light emitting surface of a second of said three individual LEDs, wherein said three individual LEDs in combination with said first and second wavelength conversion layers emit three different colors.

5. The multicolor display of claim 2, wherein said at least two LEDs emit light at a wavelength in the range of wavelengths between 4,000 and 4,912 Angstroms.

6. A multicolor display comprising a substrate; and a plurality of multicolor generation sites grown on said substrate, each of said plurality of multicolor generation sites comprised of:

at least two LEDs proximate to one another;

a wavelength conversion layer deposited on a light emitting surface of a first of said at least two LEDs, wherein said at least two LEDs in combination with said wavelength conversion layer emit at least two different colors; and an opaque material interposed between said at least two LEDs, said opaque material preventing cross-talk between said at least two LEDs.

7. The multicolor display of claim 6, further comprising an index matching layer interposed between said wavelength conversion layer and said light emitting surface of said first LED.

8. The multicolor display of claim 6, further comprising a protective layer deposited on an exterior surface of said wavelength conversion layer.

9. The multicolor display of claim 6, further comprising a protective layer deposited on a light emitting surface of a second of said at least two LEDs.

10. The multicolor display of claim 6, wherein said substrate is selected from the group consisting of sapphire, silicon carbide and gallium nitride.

11. The multicolor display of claim 6, wherein said at least two LEDs emit light at a wavelength in the range of wavelengths between 4,000 and 4,912 Angstroms.

12. The multicolor display of claim 6, further comprising a cross-talk minimization layer interposed between said substrate and said at least two LEDs.

13. The multicolor display of claim 12, wherein said cross-talk minimization layer is comprised of a Bragg reflector.

14. The multicolor display of claim 12, wherein said cross-talk minimization layer is comprised of a partially absorbing layer.

15. A multicolor display comprising a substrate; and a plurality of multicolor generation sites grown on said substrate, each of said plurality of multicolor generation sites comprised of:

three LEDs proximate and immediately adjacent to one another;

a first wavelength conversion layer deposited on a light emitting surface of a first of said three LEDs; and a second wavelength conversion layer deposited on a light emitting surface of a second of said three LEDs, wherein said three LEDs in combination with said first and second wavelength conversion layers emit three different wavelengths; and an opaque material interposed between said three LEDs, said opaque material preventing cross-talk between said three LEDs.

16. The multicolor display of claim 15, wherein said substrate is selected from the group consisting of sapphire, silicon carbide and gallium nitride.

17. The multicolor display of claim 15, wherein said first and second wavelength conversion layers are selected from the group of materials consisting of phosphors and active polymers.

18. The multicolor display of claim 15, wherein said three LEDs emit light at a wavelength in the range of wavelengths between 4,000 and 4,912 Angstroms.

19. The multicolor display of claim 15, wherein said first wavelength conversion layer converts light in a first wavelength range of between 4,000 and 4,912 Angstroms to light in a second wavelength range of between 4,912 and 5,750 Angstroms.

20. The multicolor display of claim 15, wherein said second wavelength conversion layer converts light in a first wavelength range of between 4,000 and 4,912 Angstroms to light in a second wavelength range of between 6,470 and 7,000 Angstroms.

21. The multicolor display of claim 15, further comprising:

a first index matching layer interposed between said first wavelength conversion layer and said light emitting surface of said first LED; and a second index matching layer interposed between said second wavelength conversion layer and said light emitting surface of said second LED.

22. The multicolor display of claim 15, further comprising:

a first protective layer deposited on an exterior surface of said first wavelength conversion layer; and a second protective layer deposited on an exterior surface of said second wavelength conversion layer.

23. The multicolor display of claim 22, wherein said first and second protective layers are equivalent layers.

24. The multicolor display of claim 22, further comprising a third protective layer deposited on a light emitting surface of a third of said three LEDs.

25. The multicolor display of claim 15, further comprising a plurality of channels within said substrate, said plurality of channels separating adjacent LEDs of said three LEDs, wherein said opaque material is deposited within said plurality of channels.

26. The multicolor display of claim 15, further comprising a cross-talk minimization layer interposed between said substrate and said at least two LEDs.

27. The multicolor display of claim 26, wherein said cross-talk minimization layer is comprised of a Bragg reflector.

28. The multicolor display of claim 26, wherein said cross-talk minimization layer is comprised of a partially absorbing layer.

* * * * *